(12) United States Patent
Liao et al.

(10) Patent No.: US 6,483,082 B1
(45) Date of Patent: Nov. 19, 2002

(54) HEATER LIFT LEAD SCREW FOR VERTICAL FURNACES

(75) Inventors: Miao-Cheng Liao, Yunlin (TW); Hsiang-Sheng Cheng, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 10/044,627

(22) Filed: Jan. 11, 2002

(51) Int. Cl.[7] ................................................. F27B 5/14
(52) U.S. Cl. ..................... 219/390; 392/418; 414/936; 118/729; 432/239
(58) Field of Search ............................... 219/390, 405, 219/411; 392/416, 418; 118/728, 729; 432/239, 241, 253, 244, 258; 414/935–938, 940

(56) References Cited

U.S. PATENT DOCUMENTS

| | | | | |
|---|---|---|---|---|
| 5,407,350 A | * | 4/1995 | Iwabuchi et al. | 434/241 |
| 5,658,115 A | * | 8/1997 | Yamazaki et al. | 454/225 |
| 5,697,749 A | * | 12/1997 | Iwabuchi et al. | 414/217 |
| 5,984,607 A | * | 11/1999 | Oosawa et al. | 414/222 |
| 6,368,040 B1 | * | 4/2002 | Yamasaki et al. | 414/222 |

* cited by examiner

*Primary Examiner*—Teresa Walberg
*Assistant Examiner*—Shawntina T. Fuqua
(74) *Attorney, Agent, or Firm*—Tung & Associates

(57) ABSTRACT

A heater lift mechanism with a ball screw linear actuator provides a relatively maintenance free lift mechanism with low starting torque and high positional accuracy. The heater lift mechanism can also be used to move wafer boats in a vertical furnace. The ball screw linear actuator has substantially reduced backlash over a conventional ACME thread lead screw.

10 Claims, 2 Drawing Sheets

HEATER LIFT LEAD SCREW FOR VERTICAL FURNACES

FIELD OF THE INVENTION

This invention relates to vertical furnaces as used in semiconductor manufacture in general and more particularly to the lift mechanism for moving the heater into and out of the furnace.

BACKGROUND OF THE INVENTION

Various lifts and elevators as used in vertical furnaces use variations of vertical spiral drives for moving the lift or elevator. In U.S. Pat. No. 6,168,427 issued on Jan. 2,2001 and entitled "Apparatus for Guiding the Removal of a Processing Tube From a Semiconductor Furnace" teaches a semiconductor wafer boat elevator including a boat support coupled by a lateral arm to a vertical spiral drive which moves the elevator up and down, beneath the furnace. This patent is assigned to a common assignee.

U.S. Pat. No. 6,171,453 issued on Jan. 9,2001 and entitled "Alignment Mark Shielding Ring and Method of Using" shows a wafer pedestal elevator to move the wafers into and out of the processing chamber. The movement of the elevator is typically by a vertical spiral drive. This patent is assigned to a common assignee.

U.S. Pat. No. 6,095,806 issued on Aug. 1,2000 entitled "Semiconductor Wafer Boat and Vertical Heat Treating System" teaches the use of a ball screw to move a transfer base in a vertical direction. The transfer base is guided in the vertical direction by two guide rails. In addition, another ball screw is used to move an arm carrying the wafer boat. The arm moves into and out of a processing chamber that is sealed.

In most all of the various lift lead screw mechanism, the backlash tolerance in the lead screw give rise to positioning problems. Such positioning problems create wafer scrap and lead to a maintenance program that is frequently causing the lift to be off-line. In addition the starting torque of the lift mechanism is high and the actual running of the lift mechanism along its shaft is not as smooth as desired.

SUMMARY OF THE INVENTION

These and other operational problems are substantially reduced and even eliminated in the following vertical semiconductor furnace a heater lift lead screw having a multiple diameter shaft with a first tubular bearing surface at a first end. At the opposite end of the shaft is an elongated tubular surface.

A pillow block support receives the first tubular bearing surface of the shaft and supports the shaft for rotation. A motor is positioned axially in line with the pillow block support and receives the elongated tubular surface of the shaft. The motor provides the power to rotate the shaft either a clockwise or counterclockwise direction in the pillow block support.

The shaft has a threaded portion intermediate the first and second ends of the shaft. The threaded portion has a diameter that is larger than the diameter of the first bearing surface and the elongated tubular surface. A linear actuator member with an axially extended internal threaded portion is threadably mounted on the threaded portion of the shaft for transverse travel along the threaded portion under the control of the motor. A flange is mounted on the linear actuator in a position that is transverse to the axially extended threaded portion of the shaft. The flange supports a platform that carries furnace heater into and out of the furnace in the preferred embodiment.

BRIEF DESCRIPTION OF THE DRAWINGS

These and other advantages will be found in the following drawings, in which.

DETAILED DESCRIPTION OF THE PREFERRED EMBODIMENT

Figures 1, 2:
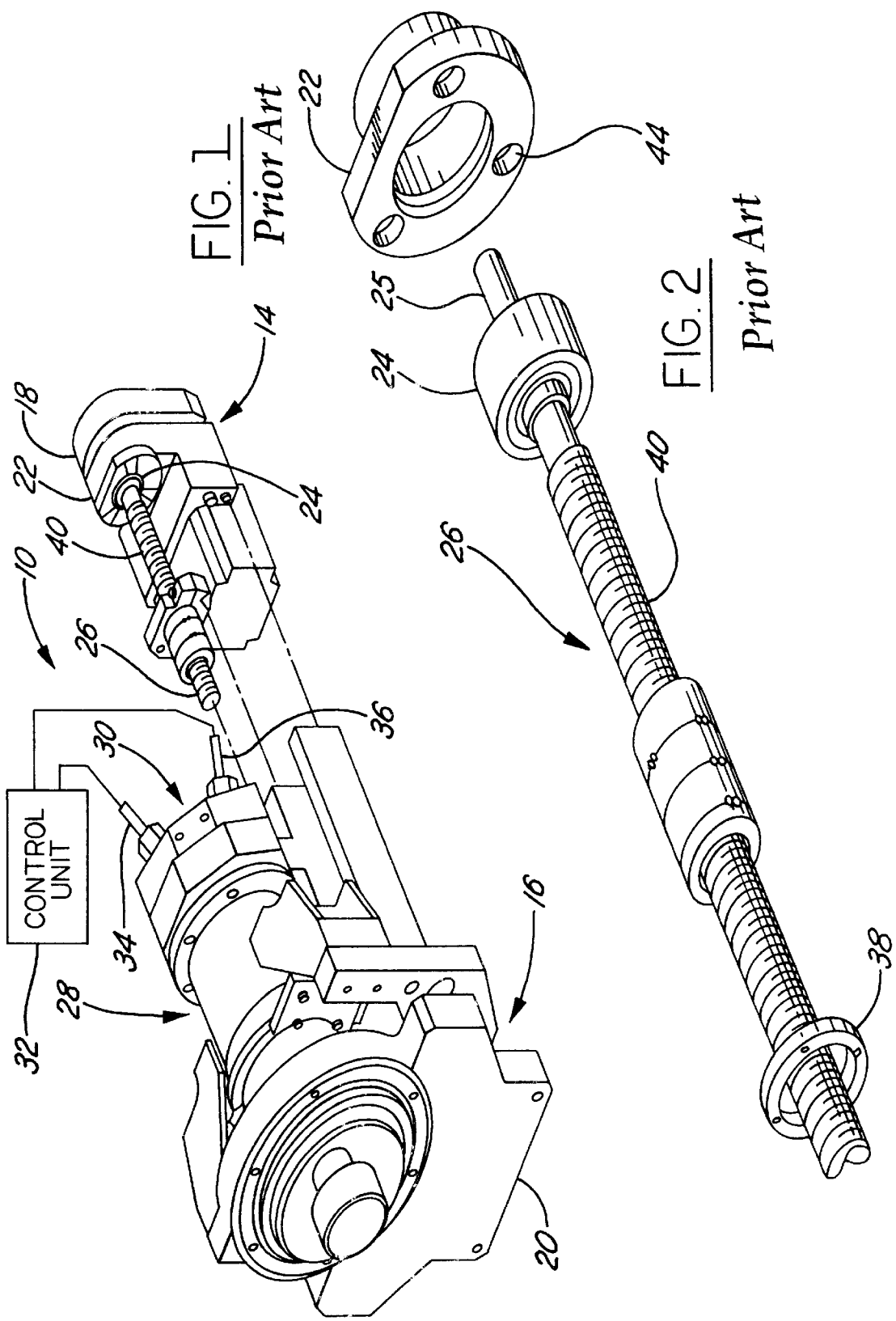
FIG. 1 is a perspective view of a prior art heater lift assembly.
FIG. 2 is a perspective view of the ACME thread lead screw mechanism of FIG. 1.

Referring to the Figs by the characters of reference, there is illustrated in FIG. 1 a prior art heater lift assembly 10. The assembly has a frame 12 extending a distance substantially equal to the height of a semiconductor vertical furnace. Each end 14, 16 of the frame 12 has a cross support member 18, 20 defining the ends of the frame 12. Mounted at one end of the frame 14 is a pillow block member 22 containing a bearing member 24. The bearing member 24 receives one end 25 of a heater lift threaded shaft 26.

At the other end of the frame 16 and mounted to the cross support member 20 is an electric motor 28. The motor 28 has a gearbox member 30 connected to the output of the motor. The gearbox member 30 functions to convert the rotational speed of the motor shaft to a much slower speed at the output of the gearbox 30 and at the same time to increase the torque output of the motor shaft.

The gearbox 30 is adapted to receive the other end of the heater lift threaded shaft 26. As the motor 28 operates, the heater lift shaft 26 is rotated at a reduced speed and increased torque than that typically delivered by the motor. The motor 28 is connected in circuit to a control unit 32 by means of terminals 34, 36 extending from the motor 28.

The other end, not shown, of the heater lift threaded shaft 26 is adapted to securely connect to the gearbox 30 by fastener members such as keyways, threaded members, pins, to name but a few fastener members. The means of connection is under the design criteria of the lift designer and is not a part of the invention herein.

FIG. 2 illustrates the heater lift shaft 26 found in the assembly of FIG. 1. There is illustrated at the other end of the shaft 26, a bearing member 38 that is located in the gearbox 30 for rotatively supporting the lift shaft 26. The lift shaft 26 has a threaded portion 40 for supporting a lead screw mechanism 42 and at the one end 25 of the shaft is another bearing 24 that is located in the pillow block 22. The pillow block 22 is mounted to the cross support member 18 of FIG. 1 by means of fasteners extending through the bolt-holes 44.

The threads are ACME threads. ACME threads require a high starting torque to get the lift into motion. ACME threads have a shorter work lifetime and are essentially a weak mechanism as they wear. One characteristic of a lead screw is backlash. Backlash is the back and forth distance, axial motion that the lead screw's nut can move with rotating either the nut or the lead screw. Backlash inherent in ACME threads creates locating problems the give rise to a condition, in semiconductor manufacturing processes, called "homing-alarm" indicating that the positioning of the lead screw linear actuator is incorrect. Such "homing-alarm" almost always results in wafer scrap and deformation of the robot blade in the mechanism of the vertical furnace and improper positioning of the heater coil.

Figure 3:
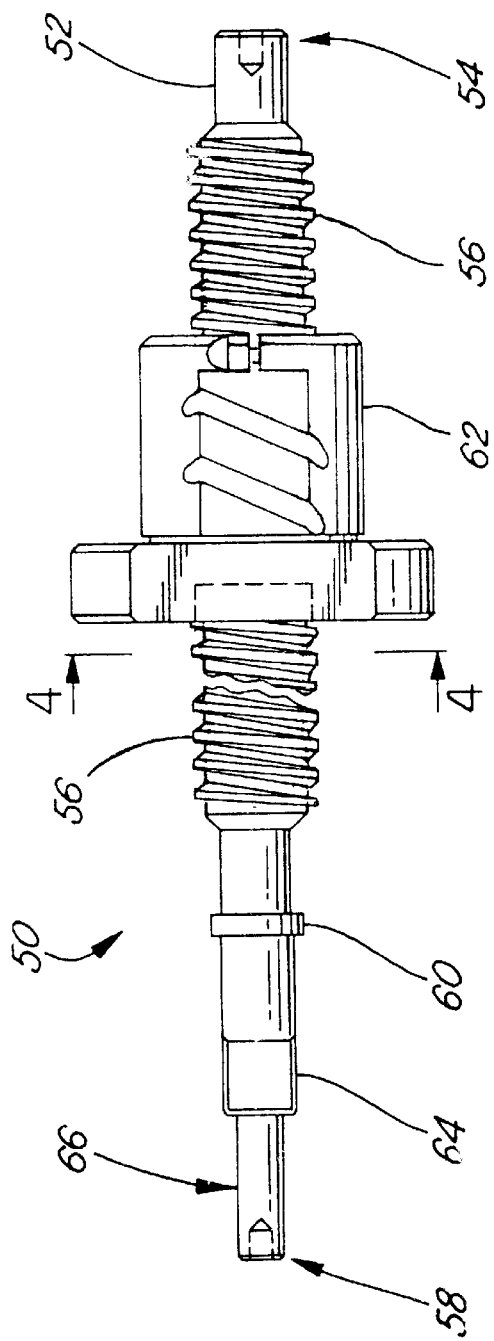
FIG. 3 is a plan view of a linear actuator mechanism of the preferred embodiment.

As illustrated in FIG. 3, the heater lift threaded shaft 50 is a multiple diameter shaft having a first tubular bearing cylindrical surface 52 at a first end 54 for mounting the shaft into the bearing member 24 of the pillow block 22. The shaft 50 will rotate under the control of the motor 28, but only the inner race of the bearing 24 in the pillow block rotates as the pillow block holds the outer race of the bearing 24 from rotation.

As we progress along the heater lift shaft 50, in a downstream direction, a next major diameter is a threaded diameter 56. The type of thread used is a precision helical groove thread. The groove in the ball screw is generally semi-circular in cross section with flat lands between adjacent convolutions of the groove. The shaft length of the threaded 56 portion is a function of the desired amount of lift for the mechanism and is determined by the designer. Between the threaded diameter portion 56 of the heater lift shaft 50 and the opposite end 58 of the lift shaft is fixed stop member 60 that is secured to the shaft and functions to halt the travel of the linear actuator or ball screw member 62 on the shaft.

In one embodiment, another bearing surface 64 is formed downstream, in a direction toward the second end 58 of the shaft from the threaded diameter 56. The function of this surface, if in fact there is one and that is a design choice of the lift shaft designer, may be to provide further bearing support of the rotating shaft. Typically the last diameter 66 at the second end 58 is a smaller diameter forming an elongated tubular surface that is connected to the output of the gearbox 30. This end 58 of the shaft forms a fastening connection to the gearbox and maybe be a key, a hole for receiving a pin, or some other fastener.

In the preferred embodiment, the linear actuator is a ball screw member 62. The ball screw member 62 moves along the threaded portion 56 of the lift shaft 50 as the motor 28 rotates the shaft in either a clockwise or counterclockwise direction. The motor housing is fixed so that it does not move or rotate. The bearings 24 in the pillow block 22 that support the lift shaft 50 allow the shaft to rotate. If there are other shaft bearings outside of the threaded portion 40, these bearings too allow the shaft to rotate in the inner races of the bearings and the outer races are secured from rotation.

It has been found that a ball screw member 62 moves along the threaded shaft 50 in a very smooth movement. The tolerance between the ball screw member 62 and the shaft is such that when the motor stops rotating, the ball screw member 62 has an extremely smaller backlash tolerance than a linear actuator with an ACME thread. The use of a ball screw member 62 reduces the friction between the movement of linear actuator and the threaded portion 56 of the lift shaft.

When a ball screw actuator 62 is used in a lift shaft for an elevator in the vertical furnaces in the semiconductor manufacturing processing of wafers, the location accuracy of the elevator results in smoother transfers of the wafers from the elevator hence a reduction in scrap. When the elevator carries the heater coil into and out of the furnace, movement of the heater due to the movement of the linear actuator may cause wafer scrap.

Figure 4:
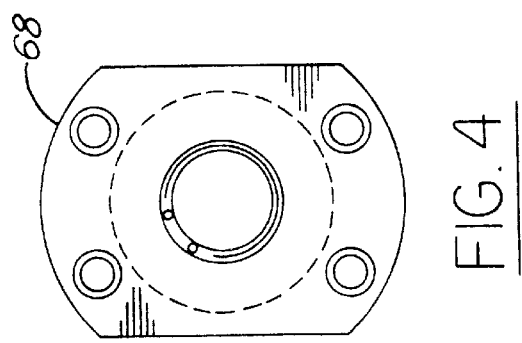
FIG. 4 is an end view taken along line 4—4 of FIG. 3.

FIG. 4 illustrates the flange 68 secured to the ball screw member 62. The flange 68 can carry the wafer boat as it is being lifted in the semiconductor manufacturing processes or it can carry the heater into and out of the vertical furnace. The plane of the flange 68 is transverse to axial length of the lift screw. Various configurations of ball screws may be selected depending upon the cost, the accuracy required and the conditions of the environment wherein the lift mechanism is used. The use of ball screws in the heater lift mechanism of the preferred embodiment results in a mechanism that is substantially maintenance-free and has less frictional forces to overcome while moving the lift.

There has thus been shown and described a lift mechanism for use in a vertical furnace. The lift mechanism has smooth rotational movement, hence a smooth translation along the shaft as the motor turns the threaded shaft. The linear actuator is a ball screw member that has low starting torque and a high positional resolution due to a very small backlash tolerance. It has been found that the time period between lubrications is much greater than with an ACME thread linear actuator.

While the present invention has been described in an illustrative manner, it should be understood that the terminology used is intended to be in a nature of words of description rather than of limitation.

Accordingly, various changes and modifications may be made to the illustrative embodiment without departing from the spirit or scope of the invention. It is to be appreciated that those skilled in the art will readily apply these teachings to other possible variations of the inventions. However, it is intended that the scope of the invention not be limited in any way to the illustrative embodiment shown and described but that the invention be limited only by claims appended hereto.

What is claimed is:

1. In a vertical semiconductor furnace a heater lift lead screw comprising:
    a multiple diameter shaft having a first tubular bearing surface at a first end thereof and an elongated tubular surface at the opposite second end;
    a pillow block support adapted to receive said first tubular bearing surface of said shaft;
    a motor axially in line with said pillow block support and adapted to receive said elongated tubular surface of said shaft, said motor adapted to rotate said shaft;
    a threaded portion of said shaft intermediate said first and second ends, said threaded portion having a diameter larger than said first bearing surface and said elongated tubular surface;
    a linear actuator member having an axially-extended internal threaded portion, said actuator member threadably mounted on said threaded portion of said shaft and adapted to travel along said threaded portion under control of said motor; and
    a flange mounted on said linear actuator transverse to said axially extended threaded portion.

2. The heater lift lead screw according to claim 1 wherein said linear actuator member is a ball-screw member for threadably moving along said threaded portion of said shaft.

3. The heater lift lead screw according to claim 1 additionally including a fixed stop member attached to said shaft intermediate said threaded portion and said elongated tubular surface, said fixed stop member for restraining said linear actuator member from leaving said threaded portion.

4. The heater lift lead screw according to claim 1 wherein said flange on said linear actuator member supports the heater of a vertical furnace.

5. The heater lift lead screw according to claim 1 wherein said motor additionally includes a gearbox mechanism connected to said motor output for driving said shaft.

6. A vertical semiconductor furnace comprising:

a heater coil located inside the furnace;

a platform for carrying said heater coil into and out of said furnace;

a multiple diameter shaft positioned with said furnace having a first tubular bearing surface at a first end thereof and an elongated tubular surface at the opposite second end;

a pillow block support adapted to receive said first tubular bearing surface of said shaft;

a motor axially in line with said pillow block support and adapted to receive said elongated tubular surface of said shaft, said motor adapted to rotate said shaft in either a clockwise or a counterclockwise rotation;

a threaded portion of said shaft intermediate said first and second ends, said threaded portion having a diameter larger than said first bearing surface and said elongated tubular surface;

a linear actuator member having an axially-extended internal threaded portion, said actuator member threadably mounted on said threaded portion of said shaft and adapted to travel along said threaded portion under control of said motor; and a flange mounted on said linear actuator transverse to said axially extended threaded portion, said flange supporting said platform for reciprocally moving said heater into and out of said furnace under control of said motor.

7. The heater lift lead screw according to claim 6 wherein said linear actuator member is a ball-screw member for threadably moving along said threaded portion of said shaft.

8. The heater lift lead screw according to claim 6 additionally including a fixed stop member attached to said shaft intermediate said threaded portion and said elongated tubular surface, said fixed stop member for restraining said linear actuator member from leaving said threaded portion.

9. The heater lift lead screw according to claim 1 wherein said motor additionally includes a gearbox mechanism connected to said motor output for driving said shaft.

10. A heater lift lead screw assembly comprising:

a multiple diameter shaft having a first tubular bearing surface at a first end thereof and an elongated tubular surface at the opposite second end;

a pillow block support adapted to receive said first tubular bearing surface of said shaft;

a motor axially in line with said pillow block support and adapted to receive said elongated tubular surface of said shaft, said motor adapted to rotate said shaft, said motor having a gearbox mechanism connected to said motor output for driving said shaft at a speed lower than the speed of the motor;

a threaded portion of said shaft intermediate said first and second ends, said threaded portion having a diameter larger than said first bearing surface and said elongated tubular surface;

a ball screw member having an axially-extended internal threaded portion, said ball screw member threadably mounted on said threaded portion of said shaft and adapted to travel along said threaded portion under control of said motor; and a flange on said ball screw member transverse to said axially extended threaded portion.

* * * * *